(12) United States Patent
Leong

(10) Patent No.: US 6,372,557 B1
(45) Date of Patent: Apr. 16, 2002

(54) METHOD OF MANUFACTURING A LATERAL FET HAVING SOURCE CONTACT TO SUBSTRATE WITH LOW RESISTANCE

(75) Inventor: Siew Kok Leong, West Lake Village, CA (US)

(73) Assignee: Polyfet RF Devices, Inc., Camarillo, CA (US)

( * ) Notice: Subject to any disclaimer, the term of this patent is extended or adjusted under 35 U.S.C. 154(b) by 0 days.

(21) Appl. No.: 09/552,239

(22) Filed: Apr. 19, 2000

(51) Int. Cl.[7] .......................................... H01L 21/335
(52) U.S. Cl. ...................................... 438/142; 257/492
(58) Field of Search .......................... 438/442; 257/492, 257/603, 370, 378, 355

(56) References Cited

U.S. PATENT DOCUMENTS

| | | | |
|---|---|---|---|
| 4,738,936 A | 4/1988 | Rice | 437/141 |
| 4,877,749 A | 10/1989 | Quigg | 437/41 |
| 5,146,298 A | * 9/1992 | Eklund | 357/22 |
| 5,155,563 A | 10/1992 | Davies et al. | 357/23.4 |
| 5,374,843 A | * 12/1994 | Williams et al. | 257/492 |
| 5,751,054 A | * 5/1998 | Yimaz et al. | 257/603 |
| 5,869,875 A | 2/1999 | Hebert | 257/382 |
| 5,949,104 A | 9/1999 | D'Anna et al. | 257/335 |

* cited by examiner

Primary Examiner—David Nelms
Assistant Examiner—David Vu

(57) ABSTRACT

A method for forming a lateral DMOS transistor comprises: a) forming a first doped region of a first conductivity type in a semiconductor substrate of the first conductivity type; b) forming an epitaxial layer on the substrate; c) forming a second doped region of the first conductivity type in the epitaxial layer; and d) forming a body region of the first conductivity type in the epitaxial layer. The process of forming the first and second doped regions and the body region includes thermally diffusing dopants in these regions so that the first and second doped regions diffuse and meet one another. The body region also meets and contacts the second doped region. The body region is electrically coupled to the substrate via the first and second doped regions. Source and drain regions are then formed in the epitaxial layer. By forming the transistor in this manner, the electrical resistance between the body region and substrate can be reduced or minimized. Also, the size of the transistor can be reduced, compared to prior art lateral DMOS transistors.

23 Claims, 5 Drawing Sheets

US 6,372,557 B1

METHOD OF MANUFACTURING A LATERAL FET HAVING SOURCE CONTACT TO SUBSTRATE WITH LOW RESISTANCE

BACKGROUND OF THE INVENTION

This invention relates to methods for manufacturing MOS field effect transistors ("MOSFETs") and the resulting transistors. This invention also relates to methods for manufacturing lateral MOSFETs and the resulting MOSFETs.

FIG. 1 illustrates in cross section a lateral DMOS MOSFET transistor 10 constructed in accordance with the prior art. Transistor 10 comprises N+ source regions 12a and 12b, a N++ drain regions 14a and 14b, N lightly doped drain region 16a laterally surrounding N++ drain region 14a, N lightly doped drain region 16b laterally surrounding N++ drain region 14b, gate insulation regions 18a, 18b, polysilicon gates 20a and 20b, and P body regions 22a and 22b, all formed in a P- epitaxial layer 24, which in turn is formed on a P++ substrate 26. (The structure shown in FIG. 1 is a small region of a much larger transistor. Gates 20 are all electrically coupled together to form one gate region. Similarly, drain regions 14 are electrically coupled together to form one drain region. Body regions 22 are electrically coupled together and to ground through P++ sinker region 28, substrate 26 and metalization 30, discussed below. Source regions 12 are coupled together and to ground through metalization 32, P++ sinker region 28, substrate 26 and metalization 30.)

As is well known in the art, one controls the amount of current permitted to flow between drain 14 and source 12 by controlling the voltage applied to gate 20. When a high voltage is applied to gate 20, a conductive channel (i.e. an inversion region) forms in a portion of body region 22 underneath gate 20, and current is permitted to flow from drain 14 to source 12. (Actually, for the case of N transistor 10, this current is conducted in the form of electrons flowing from source 12 to drain 14.)

P++ sinker 28, formed in epitaxial layer 24, is used to electrically connect P body region 22 to P++ substrate 26. Gold metalization 30 is used to couple substrate 26 to a reference voltage, e.g. ground. In this way, body region 22 is grounded during use. Body region 22 is connected to N+ source regions 12 via metalization 32 applied to the top surface of transistor 10. In this way, source region 12 is also grounded during use.

Drain region 14 is electrically contacted by metalization 34.

Transistor 10 has the following disadvantages.

1. P body region 22 is coupled to substrate 26 via P++ sinker 28, which is formed by an implantation step followed by thermal drive in. During thermal drive in, sinker 28 laterally expands to take up a large area, e.g. to a width W of about 12.0 μm. Thus, a large amount of transistor surface area is wasted to accommodate sinker 28.

2. Source region 12 and P body 22 are grounded via sinker region 28. Unfortunately, there is a substantial resistance exhibited by sinker region 28. This resistance can waste power when current flows therethrough. This resistance contributes to higher saturation voltage in the transistor, lowering efficiency and linearity of an RF amplifier comprising the transistor. It would be desirable to minimize this resistance.

SUMMARY

A method for making a transistor in accordance with one embodiment of the invention comprises:

a) forming a first doped region of a first conductivity type in a semiconductor substrate of the first conductivity type;

b) forming an epitaxial layer on the substrate;

c) forming a second doped region of the first conductivity type in the epitaxial layer;

d) performing one or more diffusion steps so that the first and second doped regions converge and electrically contact one another;

e) forming a body region in the epitaxial layer that meets and electrically contacts the second doped region;

f) forming source and drain regions in the epitaxial layer;

g) forming a gate insulation layer over at least a portion of the body region that separates the source and drain; and h) forming a gate over the gate insulation layer.

Because of the manner in which the body region is electrically connected to the substrate (i.e. using the second doped region, which serves as a "sinker" region extending downward from the top of the epitaxial layer, and the first doped region, which serves as a "riser" region extending upward from the substrate) a transistor formed in accordance with the invention can be formed in a smaller surface area than the prior art transistor of FIG. 1. This is because the sinker region of the present invention does not have to be as wide as that of FIG. 1. Further, because the electrical path from the body region to the substrate does not depend entirely on dopants introduced from the top surface of the epitaxial layer, the electrical path of the present invention can be formed such that it exhibits less resistance than the corresponding electrical path through sinker region 28 of FIG. 1.

DETAILED DESCRIPTION

FIGS. 3A to 3L illustrate in cross section a semiconductor wafer during a manufacturing process in accordance with the invention. It should be noted that the figures are not to scale. Further, FIGS. 3A to 3L illustrate only a portion of a much larger wafer. In one embodiment, the structures shown in FIGS. 3A to 3L are part of a repeating set of structures that form a much larger transistor. In addition, many other transistors are typically formed simultaneously elsewhere on the wafer.

Figure 3A:
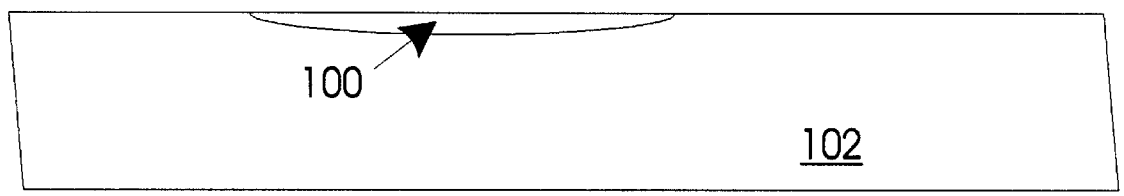
FIGS. 3A to 3L illustrate in cross section a FET during a manufacturing process in accordance with the present invention.

Referring to FIG. 3A, a process for making a FET in accordance with the present invention comprises forming a first P+++ region 100 within a P++ semiconductor substrate 102. Substrate 102 is typically boron-doped silicon, but other semiconductor materials and other dopants can be used. In one embodiment, substrate 102 has a conductivity less than 0.01 Ω-cm. P+++ region 100 is typically formed by ion implantation using boron ions. The dosage can be about $1 \times 10^{16}/cm^2$ with an implant energy of about 50 KeV. The P+++ sinker region 100 is then subjected to a thermal diffusion step.

Figure 3B:
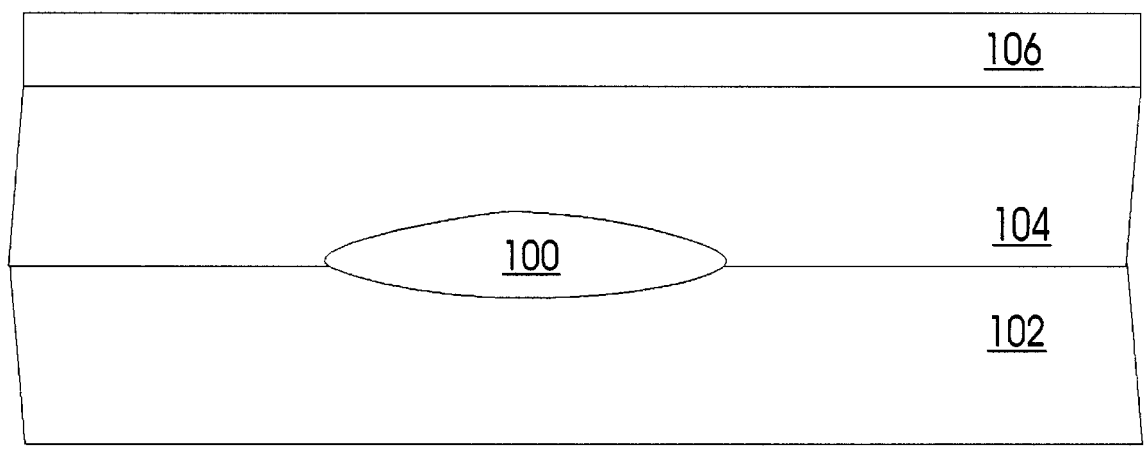
Figure 3C:
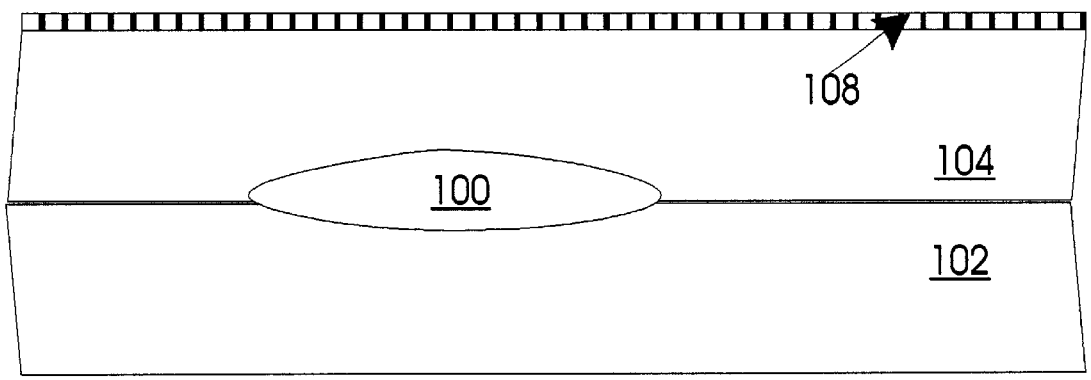

Referring to FIG. 3B, a P-epitaxial layer 104 is grown on substrate 102, e.g. to a thickness of about 9 μm. Epitaxial layer 104 is typically boron doped, e.g. to a resistivity of about 9 Ω-cm. Thereafter, a field oxide layer 106 (typically about 1 μm thick) is thermally grown on epitaxial layer 104. This process is typically accomplished at a temperature of about 1100° C. Therefore, P+++ region 100 diffuses somewhat into P-epitaxial layer 104 as shown in FIG. 3B.

A lithographic mask (not shown) is applied to field oxide layer 106 and patterned to define the active area of the wafer and expose a portion of oxide layer. The exposed portion of field oxide layer is then etched away (e.g. using an HF solution or a dry etching process), thereby exposing a portion of epitaxial layer 104. Thereafter, a gate oxide layer 108 (FIG. 3C) is thermally grown on epitaxial layer 104, e.g. to a thickness of about 80 nm. (FIGS. 3A to 3L show a portion of only the active area of the wafer. Accordingly, field oxide layer 106 is removed entirely from the portion of the wafer shown in FIGS. 3A to 3L.)

Figure 3D:
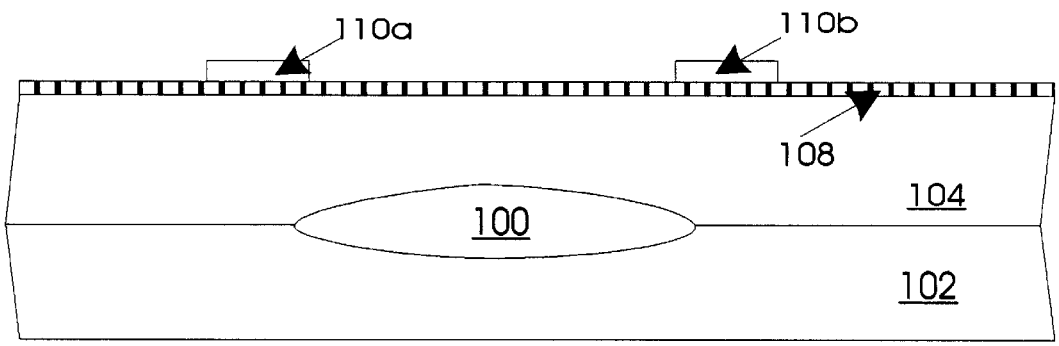

Referring to FIG. 3D, a N+ polysilicon layer is deposited on the wafer (e.g. by sputtering) and patterned to form polysilicon gates 110a, 110b.

Figure 3E:
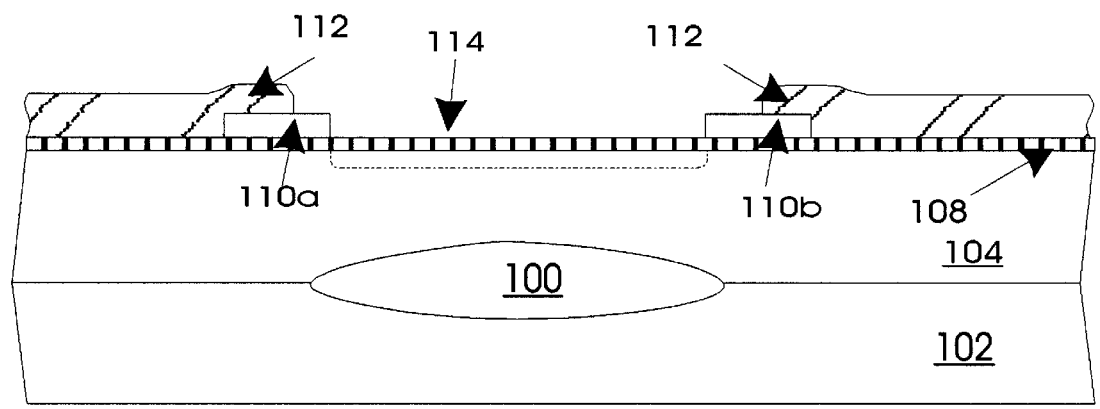

Referring to FIG. 3E, a photoresist mask 112 is applied to the wafer and patterned to define a first area 114 where additional P dopants (again, typically boron) are implanted into epitaxial layer 104. The implant dosage can be about $2.5 \times 10^{13}/cm^2$. As will become apparent below, these dopants are subsequently diffused to form a first portion of the body region of the transistor.

Figure 3F:
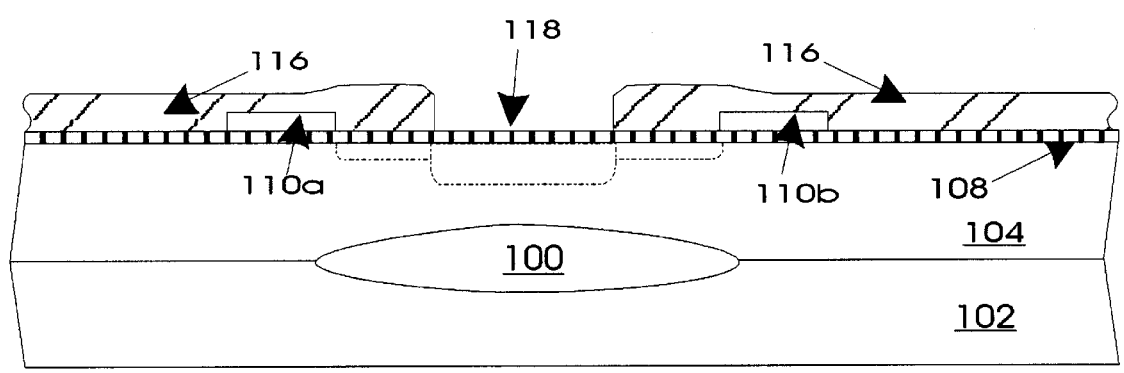

Referring to FIG. 3F, photoresist mask 112 is removed, and another photoresist mask 116 is formed on the wafer and patterned to define a second area 118 where additional P dopants (typically boron) are implanted into epitaxial layer 104. The implantation dosage can be about $3 \times 10^{15}/cm^2$. As will become apparent below, these dopants are subsequently diffused to form a sinker region for electrically contacting region 100.

Figure 3G:
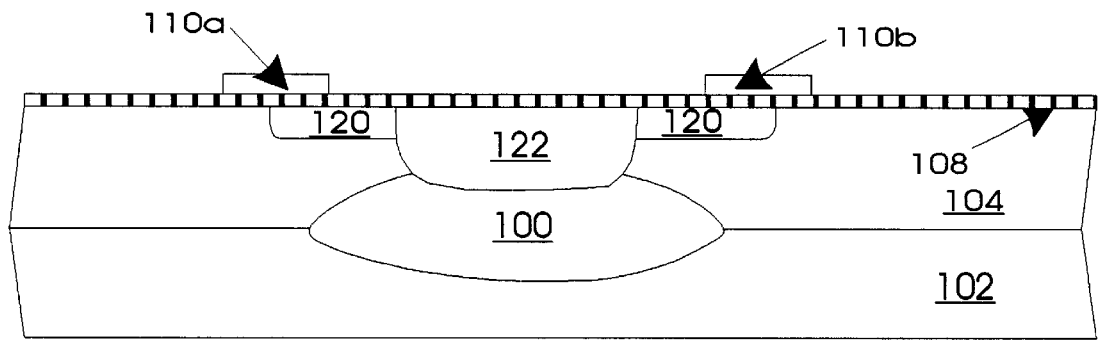

Referring to FIG. 3G, photoresist mask 116 is then removed, and the wafer is subjected to a thermal drive in step. During this thermal drive in step, P dopants from area 114 diffuse outward and downward to form P body region 120. (During this step, P body region 120 diffuses to a depth of about 1.5 μm.) Also during this thermal drive in step, P dopants from area 118 diffuse outward and downward to form upper sinker region 122. (Upper sinker region 122 typically diffuses to a depth of about 2 to 3 μm.) Also during this thermal drive in step, P dopants from region 100 diffuse upward to meet and converge with upper sinker region 122. Thus, a P sinker electrical connection forms for connecting body region 120 to substrate 102 via regions 122 and 100.

Figure 3H:
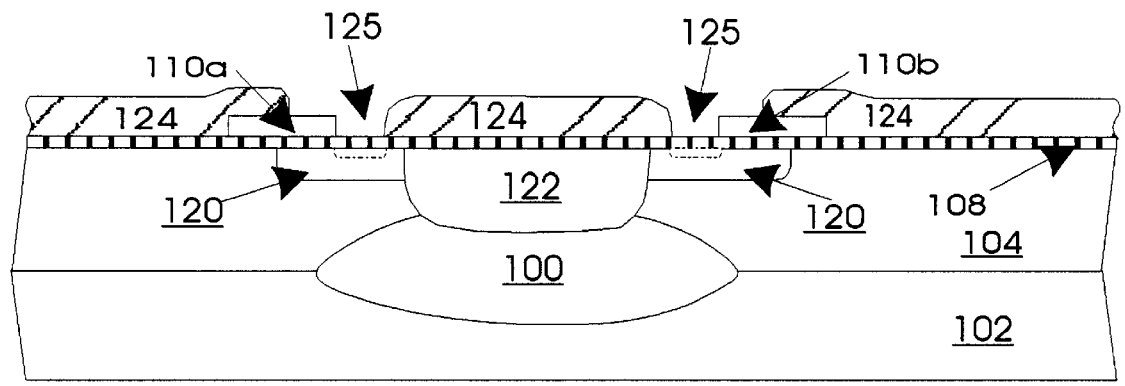
Figure 3:
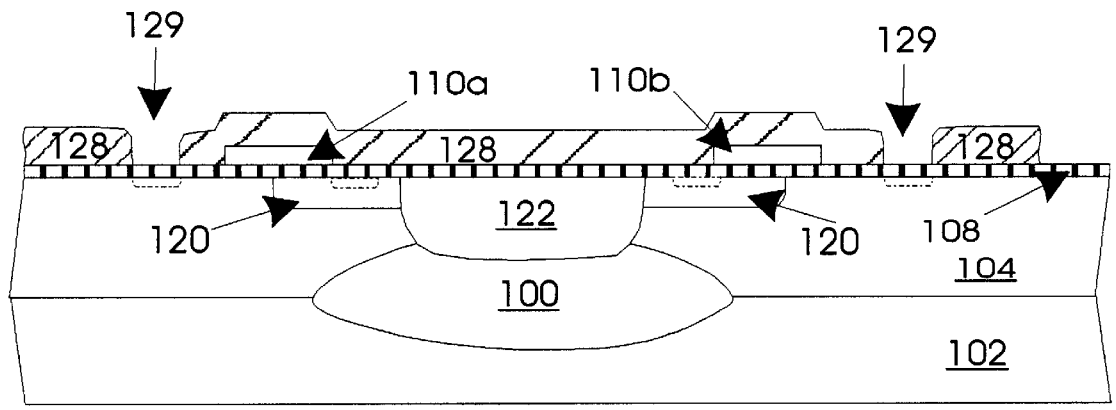
Figure 3:
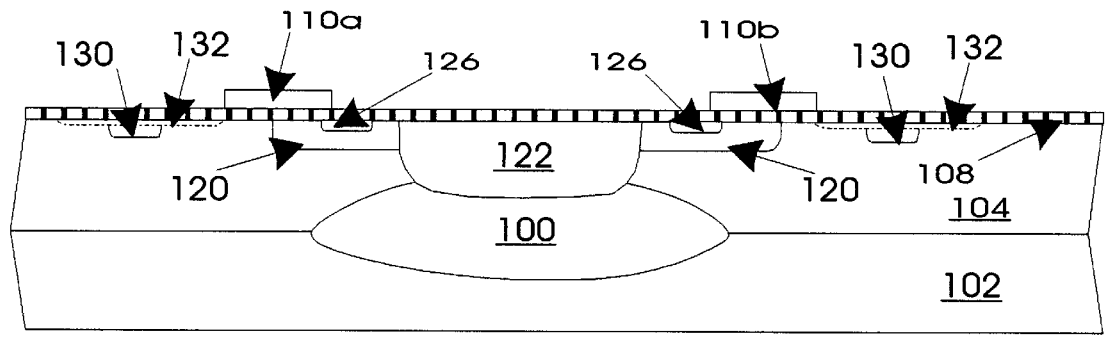
Figure 3:
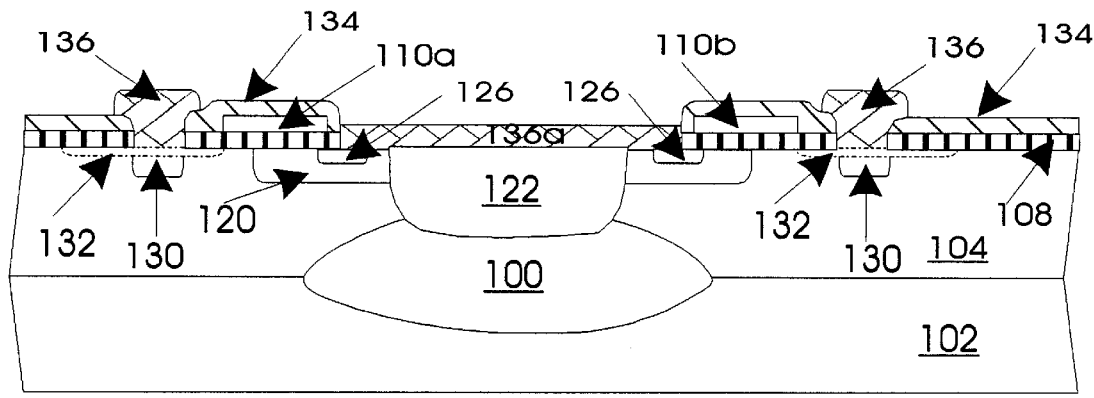
Figure 3:
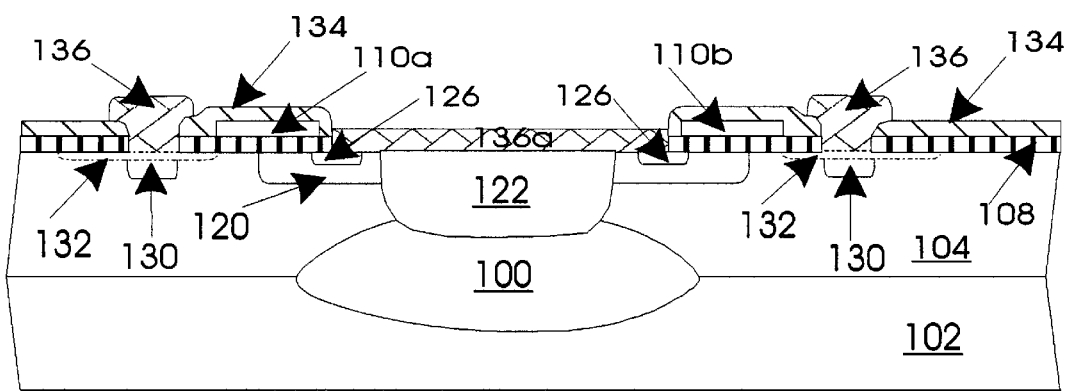

Referring to FIG. 3H, a photoresist layer 124 is deposited on the wafer and patterned to define openings where the transistor source regions are to be formed. N type dopants (e.g. arsenic) are then ion implanted, e.g. to dose of about $5 \times 10^{15}/cm^2$. Referring to FIG. 3I, photoresist layer 124 is then removed, and a photoresist layer 128 is deposited and patterned to form openings 129 where the transistor drain regions are to be formed. In one embodiment, the drain regions are formed by ion implantation using phosphorus at a dose of about $1 \times 10^{15}/cm^2$. While the above-described process uses separate implantation steps to form the source and drain regions, in other embodiments, the same implantation step can be used to form the source and drain regions.

Photoresist layer 128 is then removed, and the wafer is subjected to a thermal drive-in step to form source and drain regions 126, 130 (FIG. 3J). In one embodiment, the source and drain regions are formed to a depth of about 0.3 μm and 1.0 μm, respectively.

Thereafter, the wafer is subjected to a blanket LDD N type implantation process to form a lightly doped drain region 132. This can be accomplished using phosphorus or arsenic ion implantation at a dose of about $1 \times 10^{12}/cm^2$.

After the above-mentioned blanket implantation, polysilicon gates 110 are silicided to form a low resistive gate material. During siliciding, a metal such as platinum, titanium or cobalt is deposited on the polysilicon, e.g. by sputtering or evaporation. The polysilicon is then alloyed with the deposited metal at an elevated temperature. It is desirable during this procedure to provide a spacer adjacent to polysilicon gates 110 to prevent the silicide from shorting source regions 126 to polysilicon gates 110.

Referring to FIG. 3K, a low temperature oxide ("LTO") layer 134 is deposited on the wafer, e.g. by chemical vapor deposition. Contacts are then etched into LTO oxide layer 134, and contact metalization 136 is deposited onto the wafer, e.g. by sputtering, evaporation, or other technique. Metalization 136 can be gold or aluminum with silicon and/or copper doping. A barrier layer of titanium-tungsten can be used between the silicon and the metalization. Metalization 136 is then lithographically patterned to form the drain and gate electrical contacts. A portion 136a of metalization 136 electrically connects source region 126, body region 120 and upper sinker region 122. As described below, body region 120 is grounded by a bottom side metalization subsequently applied to substrate 102. Therefore, metalization 136a is typically not connected to bonding wires. The shorting of source 126 and body region 120 shorts a parasitic NPN bipolar transistor that could otherwise turn on and detrimentally affect operation of the DMOS transistor.

The area where metalization 136 contacts gates 110a, 110b is located at a portion of the wafer outside of the cross section of FIG. 3K.

After the above-mentioned steps are completed, a passivation layer (e.g. another oxide layer, not shown in FIG. 3L) is deposited on the wafer, and bonding pad areas are opened up in the passivation layer.

The wafer is then subjected to a bottom side lapping process to thin substrate 102. During this process, substrate 102 is thinned from an initial value of about 15 to 20 mils, to a final value of about 6 mils. This is useful for reducing the electrical resistance between the bottom side electrical contact to P body region 120 and to improve heat conduction.

Referring to FIG. 3L, a bottom side metalization layer 138 (typically gold or a gold alloy) is deposited on the bottom side of substrate 102 to facilitate electrically grounding substrate 102. The wafer is then subjected to electrical probing and testing. After testing, the wafer is cut into individual transistors.

Figure 1:
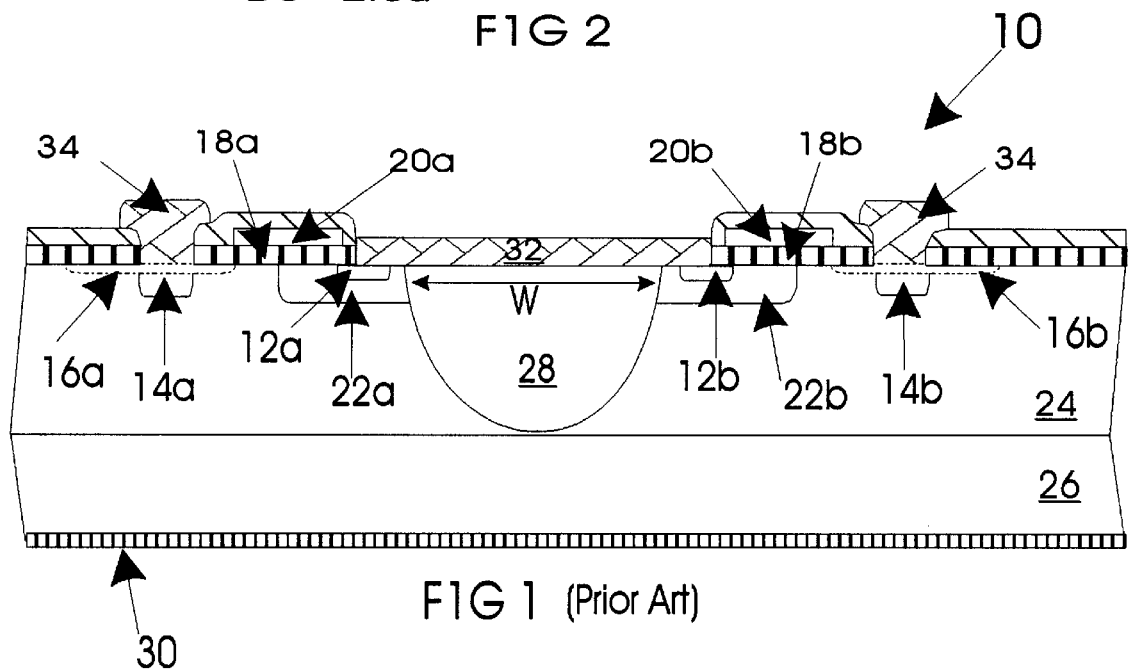
FIG. 1 illustrates in cross section a lateral DMOS FET constructed in accordance with the prior art.
Figure 4:
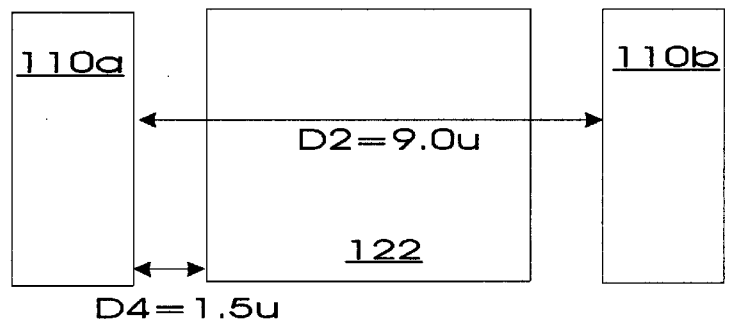
FIG. 4 illustrates in plan view some of the structures within the transistor of FIG. 3L.

A transistor in accordance with the present invention has several advantages over prior art transistor 10 (FIG. 1). For example, because sinker region 28 is formed entirely by depositing dopants from the top side of epitaxial layer 24 and then diffused entirely through the depth of layer 24, sinker 28 must be at least about 12 μm wide. Because of this, gate regions 20a and 20b must be separated by a distance D1 of about 16 μm. In contrast, P sinker region 122 extends a width that is much smaller than that of sinker 28. Therefore, gates 110a, 110b can be separated by a distance D2 of about 9 μm (FIG. 4).

Figure 2:
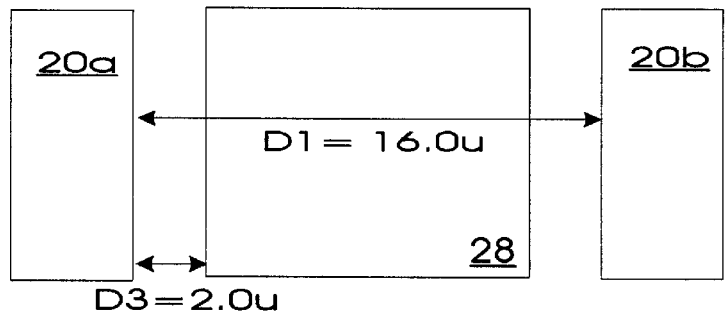
FIG. 2 illustrates in plan view some of the structures within the transistor of FIG. 1.

It is also noted that in FIGS. 1 and 2, gate 20a must be spaced a distance D3 of about 2 μm from sinker 28, whereas in contrast, gate 110a need only be placed a distance D4 of 1.5 μm from region 122. (This is because a shallower diffusion permits tighter tolerances.)

Another disadvantage of transistor 10 of FIG. 1 compared to the transistor of FIG. 3L is that the electrical resistance between body region 22 and substrate 26 is much greater than the electrical resistance between body region 120 and substrate 102. The reason for this is that the electrical connection between body region 120 and substrate 102 does not depend entirely on dopants deposited on the top side of epitaxial layer 104. Rather, the electrical connection between body region 120 and substrate 102 is aided by dopants from region 100 formed at the interface between substrate 102 and epitaxial layer 104 and diffused into epitaxial layer 104. (The electrical resistance between source 12 and ground in transistor 10 is likewise greater than the electrical resistance between source 126 and ground in the transistor of FIG. 3L.)

While the invention has been described with respect to a specific embodiment, those skilled in the art will appreciate that changes can be made in form or detail without departing from the spirit and scope of the invention. For example, the above-described process, is used to form a N channel lateral DMOS FET. However, a P channel lateral DMOS FET can be formed by reversing the dopant types. Also, different semiconductor materials, dopants, insulating materials, implantation dosages, physical dimensions (e.g. thicknesses, depths and distances) and electrically conductive contact materials can be used. In other embodiments, one can apply voltages other than ground to the transistor substrate (and thereby apply these other voltages to the source and body). One can form the various regions on in the epitaxial layer in an order other than the order set forth above. One can also form an LDMOS transistor in accordance with the present invention as part of an integrated circuit, e.g. a BiCMOS transistor. A technique in accordance with the invention can be used to provide conductive paths between the top and bottom of other types of semiconductor devices as well. Accordingly, all such changes come within the present invention.

I claim:

1. A method for making a transistor comprising:
   forming a first doped region of a first conductivity type within a semiconductor substrate of said first conductivity type;
   depositing an epitaxial layer on said semiconductor substrate;
   forming a second doped region of said first conductivity type within said epitaxial layer so that said second doped region contacts said first doped region;
   forming a body region of said first conductivity type within said epitaxial layer, said body region contacting said second doped region so that said body region is electrically coupled to said second doped region;
   forming a source within said body region and a drain spaced apart from said source; and
   forming an electrical contact to the bottom of said substrate, wherein said contact is used to conduct source current via said substrate, said first doped region and said second doped region.

2. Method of claim 1 wherein said source and drain are N type regions, said first and second doped regions are P type regions, said body region is a P type region, said epitaxial layer is a P type region and said substrate is a P type region.

3. Method of claim 1 further comprising:
   forming a gate insulation layer over at least a portion of said epitaxial layer in which said body region is formed; and
   forming a conductive gate over said gate insulation layer.

4. Method of claim 1 wherein said forming of said first and second doped regions, said body region and said source and drain regions comprises ion implantation.

5. A method for making a transistor comprising:
   forming a first doped region of a first conductivity type within a semiconductor substrate of said first conductivity type;
   depositing an epitaxial layer on said semiconductor substrate;
   forming a second doped region of said first conductivity type within said epitaxial layer so that said second doped region contacts said first doped region;
   forming a body region of said first conductivity type within said epitaxial layer, said body region contacting said second doped region so that said body region is electrically coupled to said second doped region;
   forming a source within said body region and a drain spaced apart from said source; and
   forming a metalization layer on the bottom of said substrate to thereby electrically contact said substrate.

6. Method of claim 5 further comprising thinning said substrate before forming said metalization layer on the bottom of said substrate.

7. Method of claim 5 wherein said body and source regions are electrically coupled to the metalization layer on the bottom of the substrate via said first and second doped regions.

8. Method of claim 7 further comprising performing a thermal drive-in step after forming said epitaxial layer to cause said first doped region to extend into said epitaxial layer.

9. Method of claim 8 wherein the presence of said first doped region permits the formation of said transistor using a smaller surface area and having a main current path exhibiting less resistance than if said first doped region were not formed.

10. A method for making a semiconductor device comprising:
    forming a first doped region of a first conductivity type in a semiconductor substrate of said first conductivity type;
    forming an epitaxial layer on said semiconductor substrate;
    forming a second doped region of said first conductivity type in said epitaxial layer;
    causing said first doped region to extend upward into said epitaxial layer, said first and second doped regions meeting and forming an electrically conductive path, wherein said substrate can be electrically contacted from the top surface of the epitaxial layer through said first and second doped regions; and
    forming a contact on the bottom of said substrate to thereby form a current path between said contact and the top of said epitaxial layer through said substrate and said first and second doped regions.

11. A transistor made by the method of claim 1.

12. A transistor made by the method of claim 10.

13. Method of claim 1 wherein the substrate is sufficiently heavily doped so that said contact and substrate can serve in the main current path for source current.

14. Method of claim 13 wherein said substrate is sufficiently heavily doped to provide a low resistance path for current between said contact and said source.

15. Method of claim 1 wherein said method results in an N-channel transistor, and said substrate is P+ semiconductor material.

16. Method of claim 1 wherein said method results in a P-channel transistor, and said substrate is N+ semiconductor material.

17. Method of claim 1 further comprising forming a conductive layer on the top of said epitaxial layer to connect said source and said second doped region.

18. Method of claim 1 wherein said body region is formed before said source and drain are formed.

19. A method for making a transistor comprising:

forming a first doped region of a first conductivity type within a semiconductor substrate of said first conductivity type;

depositing an epitaxial layer on said semiconductor substrate;

forming a second doped region of said first conductivity type within said epitaxial layer so that said second doped region contacts said first doped region;

forming a source within said epitaxial layer and a drain spaced apart from said source; and forming an electrical contact to the bottom of said substrate, wherein said contact is used to apply a voltage to said source via said substrate, said first doped region and said second doped region.

20. Method of claim 19 further comprising forming a body region of said first conductivity type within said epitaxial layer, said body region contacting said second doped region so that said body region is electrically coupled to said second doped region, said source being formed within said body region.

21. Method of claim 20 wherein said source is electrically coupled to said second doped region.

22. A method for making a transistor comprising:

forming a first doped region of a first conductivity type within a semiconductor substrate of said first conductivity type;

depositing an epitaxial layer on said semiconductor substrate;

forming a second doped region of said first conductivity type within said epitaxial layer so that said second doped region contacts said first doped region;

forming a source within said epitaxial layer and a drain spaced apart from said source; and forming an electrical contact to the bottom of said substrate, wherein said contact is used to conduct source current via said substrate, said first doped region and said second doped region.

23. Method of claim 22 wherein said source is electrically coupled to said second doped region.

* * * * *